United States Patent
Takeda et al.

(10) Patent No.: US 9,780,283 B2
(45) Date of Patent: Oct. 3, 2017

(54) THERMOELECTRIC CONVERSION ELEMENT

(71) Applicants: NATIONAL UNIVERSITY CORPORATION NAGAOKA UNIVERSITY OF TECHNOLOGY, Nagaoka-shi (JP); LINTEC CORPORATION, Itabashi-ku (JP)

(72) Inventors: Masatoshi Takeda, Nagaoka (JP); Tsuyoshi Mutou, Saitama (JP); Takeshi Kondo, Saitama (JP)

(73) Assignees: NATIONAL UNIVERSITY CORPORATION NAGAOKA UNIVERSITY OF TECHNOLOGY, Nagaoka-shi (JP); LINTEC CORPORATION, Itabashi-ku (JP)

(*) Notice: Subject to any disclaimer, the term of this patent is extended or adjusted under 35 U.S.C. 154(b) by 0 days.

(21) Appl. No.: 14/777,870

(22) PCT Filed: Mar. 18, 2014

(86) PCT No.: PCT/JP2014/057351
§ 371 (c)(1),
(2) Date: Sep. 17, 2015

(87) PCT Pub. No.: WO2014/148494
PCT Pub. Date: Sep. 25, 2014

(65) Prior Publication Data
US 2016/0284963 A1    Sep. 29, 2016

(30) Foreign Application Priority Data

Mar. 21, 2013 (JP) ................................. 2013-058893

(51) Int. Cl.
*H01L 35/28* (2006.01)
*H01L 35/32* (2006.01)
(Continued)

(52) U.S. Cl.
CPC .............. *H01L 35/32* (2013.01); *H01L 35/16* (2013.01); *H01L 35/18* (2013.01); *H01L 35/30* (2013.01)

(58) Field of Classification Search
CPC ........................................................ H01L 35/32
See application file for complete search history.

(56) References Cited

U.S. PATENT DOCUMENTS 6,410,971 B1    6/2002 Otey
2009/0236087 A1    9/2009 Horio
(Continued)

FOREIGN PATENT DOCUMENTS

CN    1541422 A    10/2004
EP    2 043 169 A2    4/2009
(Continued)

OTHER PUBLICATIONS

International Search Report issued Jun. 24, 2014 in PCT/JP2014/057351 filed Mar. 18, 2014.
(Continued)

*Primary Examiner* — Eli Mekhlin
(74) *Attorney, Agent, or Firm* — Oblon, McClelland, Maier & Neustadt, L.L.P.

(57) ABSTRACT

A thermoelectric conversion element that can efficiently make a temperature difference across a thermoelectric conversion material is provided. In the thermoelectric conversion element, on a first surface of a thermoelectric conversion module comprising a P-type thermoelectric element, an N-type thermoelectric element, and an electrode, a thermally conductive resin layer A and a thermally conductive resin layer B having a lower thermal conductivity than the thermally conductive resin layer A are provided in an alternating manner so as to be in direct contact with the first surface, and on a second surface on the opposite side of the first surface
(Continued)

of the thermoelectric conversion module, a thermally conductive resin layer a and a thermally conductive resin layer b having a lower thermal conductivity than the thermally conductive resin layer a are provided in an alternating manner so as to be in direct contact with the second surface.

9 Claims, 3 Drawing Sheets

(51) Int. Cl.
    *H01L 35/16*     (2006.01)
    *H01L 35/18*     (2006.01)
    *H01L 35/30*     (2006.01)

(56) References Cited

U.S. PATENT DOCUMENTS

| | | | | |
|---|---|---|---|---|
| 2010/0186424 | A1* | 7/2010 | Horio | H01L 35/30 |
| | | | | 62/3.7 |
| 2013/0306124 | A1* | 11/2013 | Yajima | H01L 35/32 |
| | | | | 136/205 |
| 2015/0136192 | A1* | 5/2015 | Jacques | H01L 35/32 |
| | | | | 136/205 |

FOREIGN PATENT DOCUMENTS

| | | | | | |
|---|---|---|---|---|---|
| EP | 12166123.5 | * | 4/2012 | ............. | H01L 35/32 |
| EP | 3 035 396 | A1 | 6/2016 | | |
| JP | 2006-186255 | A | 7/2006 | | |
| JP | 3981738 | B2 | 9/2007 | | |
| JP | 2008-120353 | A | 5/2008 | | |
| JP | 2008182160 | A * | 8/2008 | | |
| JP | 2009-188088 | A | 8/2009 | | |
| JP | 2011-35203 | A | 2/2011 | | |
| JP | WO 2012114652 | A1 * | 8/2012 | ............. | H01L 35/32 |
| WO | 2012/161336 | A1 | 11/2012 | | |

OTHER PUBLICATIONS

Extended European Search Report issued Nov. 21, 2016 in Patent Application No. 14769102.6.

* cited by examiner

Conventional Type
kb=400[W/mK]
ΔT=20[K]

Conventional Type
kb=400[W/mK]
Δx=177[μm]

THERMOELECTRIC CONVERSION ELEMENT

TECHNICAL FIELD

The present invention relates to a thermoelectric conversion element that performs mutual energy conversion between heat and electricity, particularly to a thermoelectric conversion element that can efficiently make a temperature difference across a thermoelectric element.

BACKGROUND ART

In recent years, the research and development on so-called energy harvesting (environmental power generation technique) has been widely conducted. In this technique, thermal energy released into the environment from a building, a plant, a motor vehicle, electric products, and the like is converted into electrical energy by a thermoelectric conversion element and utilized as a power supply for driving various sensors, electronic products, and the like which consume relatively low power. Since electric power is obtained as long as thermal energy is released into the environment, the thermoelectric conversion element has the feature of being able to make available low power consumption equipment and the like without caring about power supplies such as cell exchange and charging facilities. Since the thermoelectric conversion element used at present lacks in flexibility, making it difficult to be installed in a waste heat source and a radiation source each having a nonflat shape, and the enlargement of the area of the thermoelectric conversion element for obtaining sufficient energy is difficult, a thin thermoelectric conversion element having high flexibility is desired.

In the thermoelectric conversion element, for example, a P-type thermoelectric element and an N-type thermoelectric element are connected in parallel thermally and in series electrically to take out electric power. In producing the thin thermoelectric conversion element as described above, it is important in terms of the resulting electric power how efficiently a temperature difference can be made across the P-type thermoelectric element and the N-type thermoelectric element in the thickness direction.

In order to efficiently make the temperature difference, PTL 1 discloses a thermoelectric conversion element having a structure as shown in FIG. 6. Specifically, a P-type thermoelectric element 41 and an N-type thermoelectric element 42 are connected in series and thermoelectromotive force takeout electrodes 43 are arranged at both ends thereof to form a thermoelectric conversion module 46. On both surfaces of the thermoelectric conversion module 46 are provided flexible film-like substrates 44 and 45 comprising two types of materials having different thermal conductivity. On the sides of the junction surfaces between the film-like substrates 44 and 45 and the thermoelectric conversion module 46, are provided materials 47 and 48 each having a low thermal conductivity, in which a resin such as polyimide which is an insulator is used as the materials each having a low thermal conductivity. Further, on the opposite sides of the junction surfaces between the film-like substrates 44 and 45 and the thermoelectric conversion module 46, are provided materials 49 and 50 each having a high thermal conductivity so as to be located on a part of external surfaces of the substrates 44 and 45, in which a metal such as copper is used as the material having a high thermal conductivity.

CITATION LIST

Patent Literature

PTL 1: Japanese Patent No. 3981738

SUMMARY OF INVENTION

Technical Problem

However, in PTL 1, since only a material having a low thermal conductivity is in direct contact with the thermoelectric conversion module even in the region where the materials 49 and 50 each having a high thermal conductivity are provided, the temperature gradient is small in the thickness direction of the thermoelectric conversion element, and the temperature difference has not been efficiently made.

In view of the above problems, it is an object of the present invention to provide a thermoelectric conversion element that can efficiently make a temperature difference across a thermoelectric element in the thickness direction.

Solution to Problem

As a result of extensive and intensive studies to solve the above problem, the present inventors have found that a temperature difference can be efficiently made across both a P-type thermoelectric element and an N-type thermoelectric element in the thickness direction by alternately providing, on a first surface of a thermoelectric conversion module comprising a P-type thermoelectric element, an N-type thermoelectric element, and an electrode, a thermally conductive resin layer A and a thermally conductive resin layer B having a lower thermal conductivity than the thermally conductive resin layer A so as to be in direct contact with the first surface, and alternately providing, on a second surface on the opposite side of the first surface, a thermally conductive resin layer a and a thermally conductive resin layer b having a lower thermal conductivity than the thermally conductive resin layer a so as to be in direct contact with the second surface. This finding has led to the completion of the present invention.

Specifically, the present invention provides the following (1) to (8).

(1) A thermoelectric conversion element wherein on a first surface of: a thermoelectric conversion module comprising a P-type thermoelectric element, an N-type thermoelectric element, and an electrode, a thermally conductive resin layer A and a thermally conductive resin layer B having a lower thermal conductivity than the thermally conductive resin layer A are provided in an alternating manner so as to be in direct contact with the first surface, and on a second surface on the opposite side of the first surface of the thermoelectric conversion module, a thermally conductive resin layer a and a thermally conductive resin layer b having a lower thermal conductivity than the thermally conductive resin layer a are provided in an alternating manner so as to be in direct contact with the second surface.

(2) The thermoelectric conversion element according to the above (1), wherein the thermally conductive resin layer b and the thermally conductive resin layer a are provided on the second surface, as opposed to the thermally conductive resin layer A and the thermally conductive resin layer B provided on the first surface, respectively.

(3) The thermoelectric conversion element according to the above (1) or (2), wherein the thermally conductive resin layer A is in contact with the thermally conductive resin layer B, and the thermally conductive resin layer b is in contact with the thermally conductive resin layer a.

(4) The thermoelectric conversion element according to the above (1), wherein the thermally conductive resin layer A and the thermally conductive resin layer B are provided on the first surface corresponding to the P-type thermoelectric element and/or the N-type thermoelectric element, respectively; the thermally conductive resin layer b and the thermally conductive resin layer a are provided on the second surface on the opposite side of the first surface corresponding to the P-type thermoelectric element and/or the N-type thermoelectric element, respectively; and the thermally conductive resin layer A, the thermally conductive resin layer B, the thermally conductive resin layer a, and the thermally conductive resin layer b have the same width.

(5) The thermoelectric conversion element according to the above (1), wherein the thermally conductive resin layers A and a have a thermal conductivity of 0.5 (W/m·K) or more, and the thermally conductive resin layers B and b have a thermal conductivity of less than 0.5 (W/m·K).

(6) The thermoelectric conversion element according to the above (1), wherein the width of the thermally conductive resin layer A, the thermally conductive resin layer B, the thermally conductive resin layer a, and the thermally conductive resin layer b is the same as the width of the P-type thermoelectric element and the N-type thermoelectric element.

(7) The thermoelectric conversion element according to the above (1), wherein the thickness of the P-type thermoelectric element and the N-type thermoelectric element is 0.1 to 100 μm.

(8) The thermoelectric conversion element according to the above (1), wherein the thickness of the thermally conductive resin layer A, the thermally conductive resin layer B, the thermally conductive resin layer a, and the thermally conductive resin layer b is 1 to 200 μm.

Advantageous Effects of Invention

The thermoelectric conversion element of the present invention, which can efficiently make a temperature difference across a thermoelectric element in a thermoelectric conversion module, allows highly efficient power generation. Further, the thermoelectric conversion element of the present invention, which has high flexibility, allows installation in a waste heat source and a radiation source each having a nonflat surface and can be used without limiting the installation location.

DESCRIPTION OF EMBODIMENTS

[Thermoelectric Conversion Element]

In the thermoelectric conversion element of the present invention, on a first surface of a thermoelectric conversion module comprising a P-type thermoelectric element, an N-type thermoelectric element, and an electrode, a thermally conductive resin layer A and a thermally conductive resin layer B having a lower thermal conductivity than the thermally conductive resin layer A are provided in an alternating manner so as to be in direct contact with the first surface, and on a second surface on the opposite side of the first surface of the thermoelectric conversion module, a thermally conductive resin layer a and a thermally conductive resin layer b having a lower thermal conductivity than the thermally conductive resin layer a are provided in an alternating manner so as to be in direct contact with the second surface.

The structure and the like of the thermoelectric conversion element of the present invention will be described using the drawings.

Figure 1:
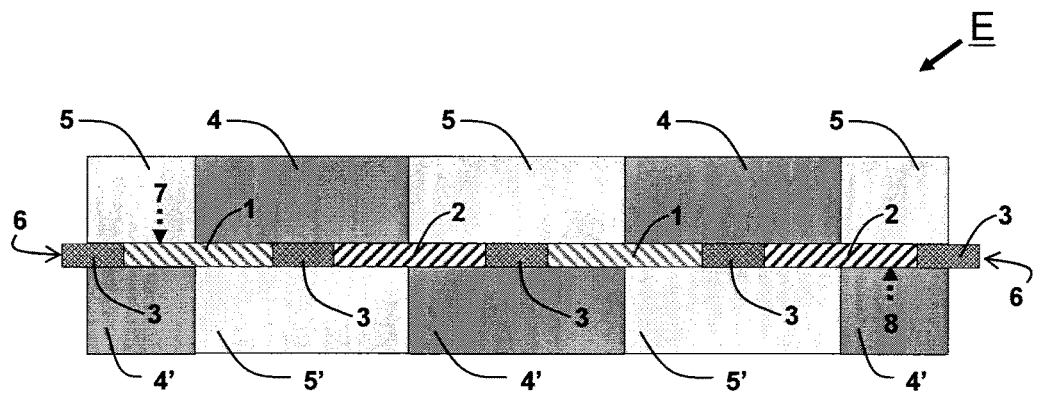
FIG. 1 is a sectional view showing an example of the thermoelectric conversion element of the present invention.

FIG. 1 shows an example of the thermoelectric conversion element of the present invention. A thermoelectric conversion element E shown in FIG. 1 is a thermoelectric conversion element that converts heat into electricity using the temperature difference in the thickness direction, in which a thin P-type thermoelectric element 1 formed of a P-type material, a thin N-type thermoelectric element 2 formed of an N-type material, and an electrode 3 are provided to form a thermoelectric conversion module 6; a thermally conductive resin layer A4 and a thermally conductive resin layer B5 having a lower thermal conductivity than the thermally conductive resin layer A4 are alternately provided on a first surface 7 of the thermoelectric conversion module 6 so as to be in direct contact with the first surface 7; and a thermally conductive resin layer a4' and a thermally conductive resin layer b5' having a lower thermal conductivity than the thermally conductive resin layer a4' are alternately provided on a second surface 8 on the opposite side of the first surface 7 so as to be in direct contact with the second surface 8. With respect to the arrangement of each thermally conductive resin layer, the thermally conductive resin layer b5' and the thermally conductive resin layer a4' are preferably provided on the second surface 8, as opposed to the thermally conductive resin layer A4 and the thermally conductive resin layer B5 on the first surface 7, respectively.

Figure 2:
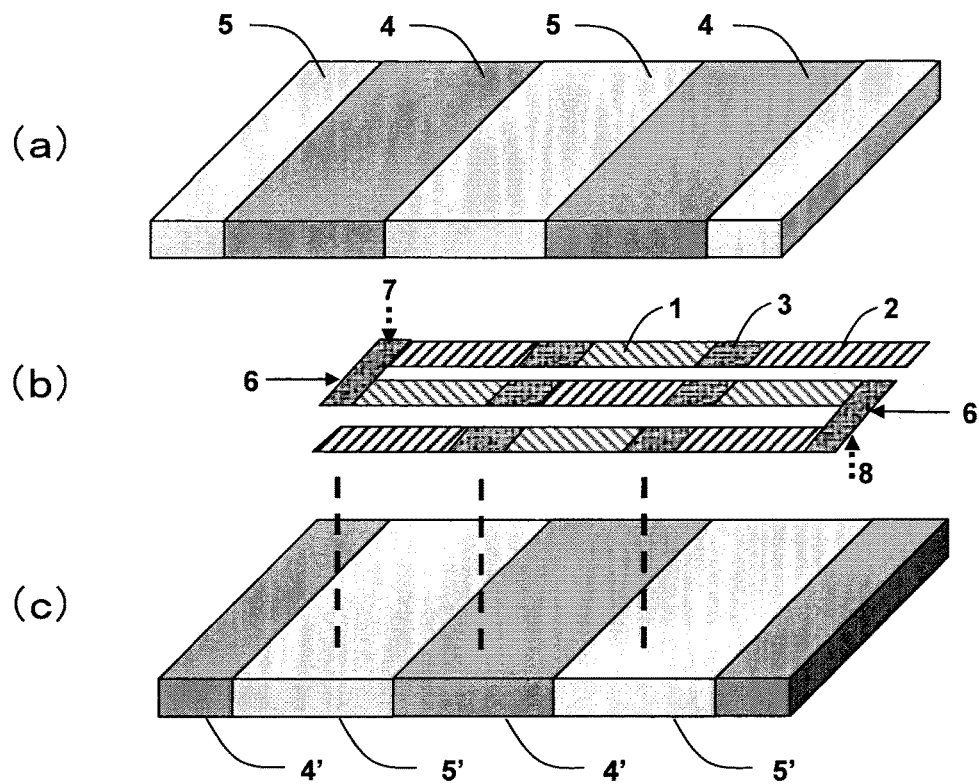
FIG. 2 shows a perspective view obtained by exploding the thermoelectric conversion element of the present invention into every component, in which (a) is a perspective view of a thermally conductive resin layer A and a thermally conductive resin layer B provided on the first surface side; (b) is a perspective view of a thermoelectric conversion module; and (c) is a perspective view of a thermally conductive resin layer b and a thermally conductive resin layer a provided on the second surface side.

FIG. 2 shows a perspective view obtained by exploding the thermoelectric conversion element of FIG. 1 into every component, in which (a) is a perspective view of the thermally conductive resin layer A and the thermally conductive resin layer B provided on the first surface side; (b)

is a perspective view of the thermoelectric conversion module; and (c) is a perspective view of the thermally conductive resin layer a and the thermally conductive resin layer b provided on the second surface side.

A temperature difference can be made in the thermoelectric conversion module 6 between the first surface 7 and the second surface 8 by taking the structure as described above. Thereby, a temperature difference (temperature gradient) can be efficiently made across the thermoelectric elements by the difference between the thermal conduction (heat flux) distribution on the first surface side 7 and the thermal conduction (heat flux) distribution on the second surface side 8. The thermoelectric conversion module 6 can efficiently generate electricity using the resulting temperature gradient.

The thermoelectric conversion module 6 used in the present invention comprises a P-type thermoelectric element 1, an N-type thermoelectric element 2, and an electrode 3, as shown in FIG. 2(b). The P-type thermoelectric element 1 and the N-type thermoelectric element 2 are formed on a thin film so that these elements are connected in series, and these elements are joined to each other at respective ends through the electrode 3 and electrically connected. Note that the P-type thermoelectric element 1 and the N-type thermoelectric element 2 in the thermoelectric conversion module 6 may be arranged as follows: "electrode 3, P-type thermoelectric element 1, electrode 3, N-type thermoelectric element 2, electrode 3, . . . " as shown in FIG. 1, or may be arranged as follows: "electrode 3, P-type thermoelectric element 1, N-type thermoelectric element 2, electrode 3, P-type thermoelectric element 1, N-type thermoelectric element 2, electrode 3, . . . ", or may be arranged as follows: "electrode 3, P-type thermoelectric element 1, N-type thermoelectric element 2, P-type thermoelectric element 1, N-type thermoelectric element 2, electrode 3, . . . ". Further, the thermoelectric conversion module 6 may be directly formed on the thermally conductive resin layer A4 and the thermally conductive resin layer B5 as shown in FIG. 1, or may be formed through other layers. However, the thermoelectric conversion module 6 is preferably directly formed on the thermally conductive resin layer A4 and the thermally conductive resin layer B5 in that a temperature difference can be efficiently made across the thermoelectric elements.

A material for use in the thermoelectric conversion element is not particularly limited, but it is preferred to use a material having a large absolute value of the Seebeck coefficient, a low thermal conductivity, and a high electrical conductivity, that is, so-called a material having a high thermoelectric figure of merit, in the temperature region of a heat source to be converted into electrical energy by the thermoelectric conversion module.

The materials forming the P-type thermoelectric element and the N-type thermoelectric element are not particularly limited as long as they have thermoelectric conversion characteristics. Examples of the materials which are used include bismuth-tellurium-based thermoelectric semiconductor materials such as bismuth telluride and $Bi_2Te_3$; telluride-based thermoelectric semiconductor materials such as GeTe and PbTe; antimony-tellurium-based thermoelectric semiconductor materials; zinc-antimony-based thermoelectric semiconductor materials such as ZnSb, $Zn_3Sb_2$, and $Zn_4Sb_3$; silicon-germanium-based thermoelectric semiconductor materials such as SiGe; bismuth-selenide-based thermoelectric semiconductor materials such as $Bi_2Se_3$; silicide-based thermoelectric semiconductor materials such as $\beta$-$FeSi_2$, $CrSi_2$, $MnSi_{1.73}$, and $Mg_2Si$; oxide-based thermoelectric semiconductor materials; and Heusler materials such as FeVAl, FeVAlSi, and FeVTiAl. Among these materials, materials such as bismuth-tellurium-based thermoelectric semiconductor materials such as bismuth telluride and $Bi_2Te_3$; silicide-based thermoelectric semiconductor materials such as $\beta$-$FeSi_2$, $CrSi_2$, $MnSi_{1.73}$, and $Mg_2Si$; and PEDOT:PSS are preferred.

The thickness of the P-type thermoelectric element 1 and the N-type thermoelectric element 2 is preferably 0.1 to 100 μm, more preferably 1 to 50 μm.

Note that the thickness of the P-type thermoelectric element 1 and the N-type thermoelectric element 2 may be the same or different, but is not particularly limited thereto.

Further, the thermally conductive resin layer A and the thermally conductive resin layer B may or may not be in contact with each other on the first surface 7 of the thermoelectric conversion module 6, but are preferably in contact with each other in terms of efficiently making a temperature difference in the thermoelectric conversion module 6 and maintaining mechanical strength.

Further, the thermally conductive resin layer a and the thermally conductive resin layer b may or may not be in contact with each other on the second surface 8 of the thermoelectric conversion module 6, but are preferably in contact with each other in terms of efficiently making a temperature difference in the thermoelectric conversion module 6 and maintaining mechanical strength.

The width of the thermally conductive resin layer A and the thermally conductive resin layer B may be the same as or different from the width of the P-type thermoelectric element 1 and the N-type thermoelectric element 2, respectively. Further, the width of the thermally conductive resin layer a and the thermally conductive resin layer b may be the same as or different from the width of the P-type thermoelectric element 1 and the N-type thermoelectric element 2, respectively. In terms of being able to efficiently make a temperature difference in the thermoelectric conversion module 6, the width of the thermally conductive resin layer A, the thermally conductive resin layer B, the thermally conductive resin layer a, and the thermally conductive resin layer b is preferably the same, more preferably the same as the width of the P-type thermoelectric element 1 and the N-type thermoelectric element 2. Note that in the present invention, "width" means the length in the longitudinal direction (x axis) in FIG. 3. Further, it is preferred that the thermally conductive resin layer A and the thermally conductive resin layer B be provided on the first surface 7 of the thermoelectric conversion module corresponding to the P-type thermoelectric element 1 and N-type thermoelectric element 2, respectively, and the thermally conductive resin layer b and the thermally conductive resin layer a be provided on the second surface 8 so that the thermal conductivity on the first surface 7 and that on the second surface 8 may be different from each other.

The thermally conductive resin layer A may be a resin layer formed of a single material or may be a resin layer formed of a plurality of materials, but a resin material in which a highly thermally conductive filler is dispersed is preferably used in terms of obtaining thermal conductivity that is higher than the thermal conductivity of the thermally conductive resin layer B.

The resin material that forms the thermally conductive resin layer A includes a thermosetting resin, a thermoplastic resin, and a photocurable resin. Examples of the resin that form the thermally conductive resin layer A include polyolefin-based resins such as polyethylene and polypropylene; styrenic resins such as polystyrene; acrylic resins such as polymethyl methacrylate; amide-based resins such as polyamide (such as nylon 6 and nylon 66), poly-m-phenyleneisophthalamide, and poly-p-phenyleneterephthalamide; polyester-based resins such as polyethylene terephthalate, polybutylene terephthalate, polyethylene naphthalate, and polyarylate; cycloolefin-based polymers such as norbornene-based polymers, monocyclic cycloolefin-based polymers, cyclic conjugated diene-based polymers, and vinyl alicyclic hydrocarbon polymers, and hydrogenated products thereof; vinyl chloride; polyimide; polyamideimide; polyphenylene ether; polyether ketone; polyether ether ketone; polycarbonate; polysulfone-based resins such as polysulfone and polyethersulfone; polyphenylene sulfide; and combinations of two or more of these polymers.

Examples of the highly thermally conductive filler include, but are not particularly limited to, alumina, silica, and boron nitride. Among these fillers, alumina and boron nitride are preferred, and alumina is particularly preferred in terms of economy. Further, particles of a conductive material such as metal and a semiconductor material may be dispersed in the range that does not adversely affect the performance of the thermoelectric conversion element. The content of the highly thermally conductive filler in the thermally conductive resin layer A is suitably adjusted depending on desired thermal conductivity, and is preferably in the range of generally 30 to 60% by mass.

The thermal conductivity of the thermally conductive resin layer A may be higher than that of the thermally conductive resin layer B, and the thermal conductivity is preferably 0.5 (W/m·K) or more, more preferably 2.0 (W/m·K) or more, particularly preferably 10.0 (W/m·K) or more. The upper limit of the thermal conductivity of the thermally conductive resin layer A is not particularly limited, but the thermal conductivity is preferably 1000 (W/m·K) or less, more preferably 500 (W/m·K) or less.

The electrical conductivity of the thermally conductive resin layer A is not particularly limited as long as insulation is held between the thermally conductive resin layer A and the thermoelectric conversion module comprising a P-type thermoelectric element 1, an N-type thermoelectric element 2, and an electrode.

The thickness of the thermally conductive resin layer A is preferably 1 to 200 μm, more preferably 3 to 150 μm. These ranges are preferred in that a temperature difference can be efficiently made in the thermoelectric conversion module, and the flexibility and the mechanical strength of the thermoelectric conversion module can be maintained.

The thermally conductive resin layer B may be a resin layer formed of a single material or may be a resin layer formed of a plurality of materials, but a single resin material can be used because the thermally conductive resin layer B may be a resin layer having a lower thermal conductivity than the thermally conductive resin layer A.

The resin material forming the thermally conductive resin layer B is not particularly limited as long as the resin material provides a lower thermal conductivity than that of the thermally conductive resin layer A, but the resin material is suitably determined among the resins illustrated as the resin materials forming the thermally conductive resin layer A as described above.

The thermal conductivity of the thermally conductive resin layer B is preferably less than 0.5 (W/m·K), more preferably 0.3 (W/m·K) or less, further preferably 0.1 (W/m·K) or less.

The electrical conductivity of the thermally conductive resin layer B is not particularly limited as long as insulation is held between the thermally conductive resin layer B and the thermoelectric conversion module used comprising a P-type thermoelectric element 1, an N-type thermoelectric element 2, and an electrode.

The thickness of the thermally conductive resin layer B is preferably 1 to 200 μm, more preferably 3 to 150 μm. These ranges are preferred in that a temperature difference can be efficiently made in the thermoelectric conversion module, and the flexibility and the mechanical strength of the thermoelectric conversion module can be maintained.

The resin material and the highly thermally conductive filler for the thermally conductive resin layer a can be selected from, but are not particularly limited to, the same resin materials and the same highly thermally conductive fillers, respectively, as those for the thermally conductive resin layer A. Further, the thermal conductivity, the electrical conductivity, the thickness, and the like can be selected from the same ranges as those of the thermally conductive resin layer A. It is preferred to use the same materials as those used for the thermally conductive resin layer A in terms of the ease of production and cost.

The resin material for the thermally conductive resin layer b can be selected from, but is not particularly limited to, the same resin materials as those for the thermally conductive resin layer B. Further, the thermal conductivity, the electrical conductivity, the thickness, and the like can be selected from the same ranges as those of the thermally conductive resin layer B. It is preferred to use the same materials as those used for the thermally conductive resin layer B in terms of the ease of production and cost.

Examples of the method of forming the thermally conductive resin layer A, the thermally conductive resin layer B, the thermally conductive resin layer a, and the thermally conductive resin layer b include, but are not particularly limited to, a method of forming the resin material that forms each layer by stencil printing, a dispenser, screen printing, or a roll coating method.

The thermally conductive resin layer A and the thermally conductive resin layer B or the thermally conductive resin layer a and the thermally conductive resin layer b may be formed on the first surface of the thermoelectric conversion module or the second surface thereof; or the thermoelectric conversion module may be previously formed on the thermally conductive resin layer A and the thermally conductive resin layer B or on the thermally conductive resin layer a and the thermally conductive resin layer b.

[Internal Heat Analysis of Thermoelectric Conversion Element]

Figure 3:
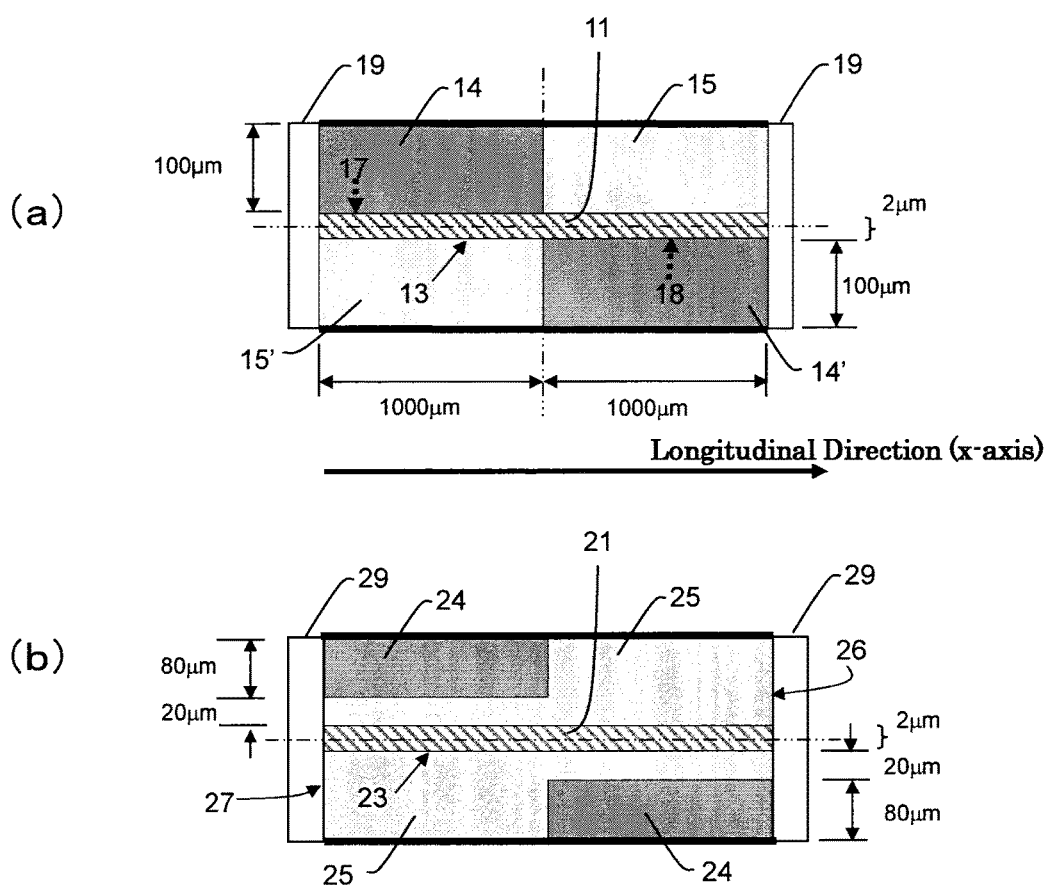
FIG. 3 is an explanatory view of a sectional structure of a thermoelectric conversion element model for the simulation calculation of the internal temperature distribution of a thermoelectric conversion element, in which (a) is a sectional structure of the thermoelectric conversion element model of the present invention, and (b) is a sectional structure of a thermoelectric conversion element model of a conventional type.

Next, in order to investigate the internal temperature distribution of the thermoelectric element in the thermoelectric conversion module, the present inventors have performed simulation calculation (steady heat conduction analysis) for the model of the thermoelectric conversion element having a structure shown in FIG. 3 using a finite element program (product name: ANSYS-CFD, manufactured by ANSYS Japan, K.K.).

Figure 4:
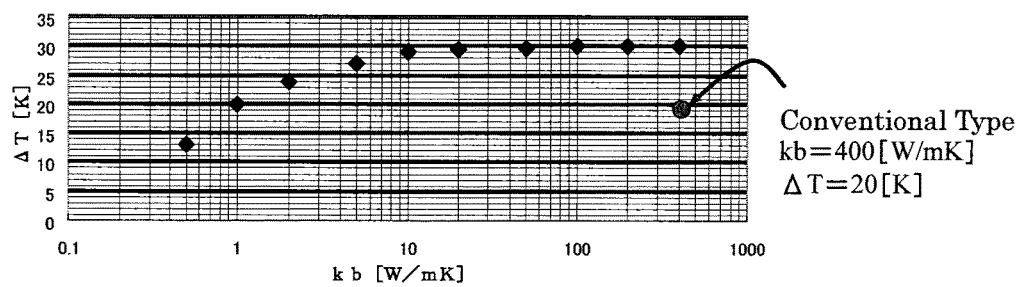
FIG. 4 shows simulation results for the maximum temperature difference ΔT to be made and the thermal conductivity kb of a thermally conductive resin layer A, in a sectional structure of the present invention.
Figure 5:
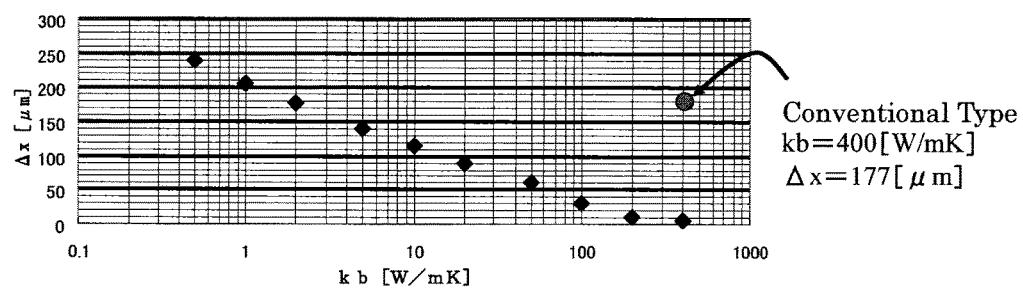
FIG. 5 shows simulation results for the temperature transition region Δx and the thermal conductivity kb of a thermally conductive resin layer A, in a sectional structure of the present invention.
Figure 6:
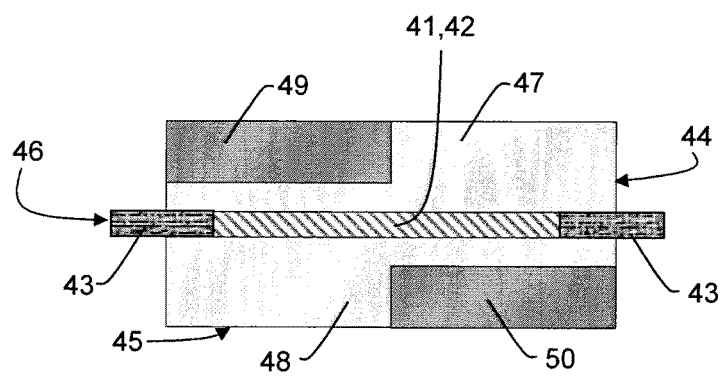
FIG. 6 is a sectional view showing an example of a conventional thermoelectric conversion element.

FIG. 4 shows simulation results for the maximum temperature difference ΔT to be made and the thermal conductivity kb of the thermally conductive resin layer A, in a sectional structure of the present invention. Similarly, FIG. 5 shows simulation results for the temperature transition region Δx and the thermal conductivity kb of the thermally conductive resin layer A, in a sectional structure of the present invention.

FIG. 3 is an explanatory view of a sectional structure of a thermoelectric conversion element model for the simulation calculation of the internal temperature distribution of a thermoelectric conversion element, in which (a) is a sectional structure of the thermoelectric conversion element model of the present invention, and (b) is a sectional structure of a thermoelectric conversion element model of a conventional type. Note that, in the thermoelectric conversion element models shown in FIGS. 3(a) and (b), thermal insulation parts 19 and 29 are arranged on the side surfaces of the thermoelectric conversion element, and electrodes were omitted for simplification.

In the thermoelectric conversion element model shown in FIG. 3(a), on a first surface 17 of the thermoelectric conversion module 13 comprising a P-type thermoelectric element 11, an N-type thermoelectric element (not shown), and an electrode (not shown), a thermally conductive resin layer A14 and a thermally conductive resin layer B15 having a lower thermal conductivity than the thermally conductive resin layer A are provided in an alternating manner so as to be in direct contact with the first surface 17, and on a second surface 18 on the opposite side of the first surface 17, a thermally conductive resin layer a14' and a thermally conductive resin layer b15' having a lower thermal conductivity than the thermally conductive resin layer a are provided in an alternating manner so as to be in direct contact with the second surface 18.

On the other hand, the thermoelectric conversion element model of a conventional type shown in FIG. 3(b) comprises: a thermoelectric conversion module 23 comprising a P-type thermoelectric element 21; and flexible film-like substrates 26 and 27 comprising two types of materials each having different thermal conductivity that are provided on both surfaces of the thermoelectric conversion module 23. In these film-like substrates 26 and 27, polyimide 25 is provided on the side of the junction surfaces between the film-like substrates 26 and 27 and the thermoelectric conversion module 23 as a material having a lower thermal conductivity. Further, in the film-like substrates 26 and 27, a metal (copper) 24 is provided on the opposite side of the junction surfaces between the film-like substrates 26 and 27 and the thermoelectric conversion module 23 so as to be located in a part of the external surfaces of the substrates 26 and 27 as a material having a higher thermal conductivity.

In the sectional structure of the thermoelectric conversion element model of the present invention shown in FIG. 3(a), simulation calculation was performed on the internal temperature distribution of the thermoelectric conversion module when heat was applied to the lower surface of the thermoelectric conversion element under the condition of thermally insulating both ends (thermal insulation part 19) and under the following conditions.
Upper surface temperature: 300K
Lower surface temperature: 330K
Thickness of thermally conductive resin layer A14 and thermally conductive resin layer a14': 100 μm
Thermal conductivity kb of thermally conductive resin layer A14 and thermally conductive resin layer a14': kb=0.5 to 400 (W/m·K)
Width of thermally conductive resin layer A14 and thermally conductive resin layer a14': 1000 μm
Thickness of thermally conductive resin layer B15 and thermally conductive resin layer b15': 100 μm
Thermal conductivity of thermally conductive resin layer B15 and thermally conductive resin layer b15': 0.2 (W/m·K)
Width of thermally conductive resin layer B15 and thermally conductive resin layer b15': 1000 μm
Thickness of P-type thermoelectric element 11: 2 μm
Thermal conductivity of P-type thermoelectric element 11 (assuming Chromel): 10 (W/m·K)

Length of P-type thermoelectric element 11 in the longitudinal direction (x axis): 2000 μm Specifically, the temperature difference of a thermoelectric conversion element in the longitudinal direction (x axis) was calculated by using the thermal conductivity kb of a thermally conductive resin layer A as a variable to determine the maximum temperature difference ΔT. Note that the range of the thermoelectric conversion element in the longitudinal direction (x axis) is x=500 to 1500 μm, where temperature change significantly appears, by setting the left end of the P-type thermoelectric element 11 to x=0 in FIG. 3(a). As described above, FIG. 4 shows simulation results for the maximum temperature difference ΔT to be made and the thermal conductivity kb of a thermally conductive resin layer A, in a sectional structure of the present invention.

Further, the region length from the position showing 10% of the resulting maximum temperature difference ΔT in the longitudinal direction (x axis) to the position showing 90% thereof in the longitudinal direction (x axis) was calculated by the following formula (1), in which the region length was defined as a temperature transition region Δx.

Temperature transition region Δx=|x(temperature difference: 0.10×ΔT)−x(temperature difference: 0.90×ΔT)|  (1)

As described above, FIG. 5 shows simulation results for the temperature transition region Δx and the thermal conductivity kb of the thermally conductive resin layer A, in a sectional structure of the present invention.

Similarly, in the structure of the thermoelectric conversion element model of a conventional type shown in FIG. 3(b), a simulation was performed on the internal temperature distribution of the thermoelectric conversion module when heat was applied to the lower surface of the thermoelectric conversion element under the condition of thermally insulating both ends (thermal insulation part 29) and under the following conditions. As a result of the simulation, in the structure of the thermoelectric conversion element model of a conventional type shown in FIG. 3(b), the maximum temperature difference ΔT was 20° C. when the thermal conductivity kb of the thermally conductive resin layer A was 400 (W/m·K).

Further, the temperature transition region Δx for the thermal conductivity kb of the thermally conductive resin layer A was calculated similarly. The simulation result that the temperature transition region Δx is 177 μm was obtained.
Upper surface temperature: 300K
Lower surface temperature: 330K
Thickness of thermally conductive resin layer A24: 80 μm
Thermal conductivity kb of thermally conductive resin layer A24: kb=400 (W/m·K)
Thickness of thermally conductive resin layer B25: 100 μm (wherein the thickness of the thermally conductive resin layer B25 sandwiched by metal (copper) and the thermoelectric element: 20 μm)
Thermal conductivity of thermally conductive resin layer B25 (polyimide): 0.2 (W/m·K)
Thickness of P-type thermoelectric element 21: 2 μm
Length of P-type thermoelectric element 21 in the longitudinal direction (x axis): 2000 μm
Thermal conductivity of P-type thermoelectric element 21 (assuming Chromel): 10 (W/m·K)

As shown in FIG. 4, in the thermoelectric conversion element model of the present invention, the simulation results were obtained that the maximum temperature difference ΔT increases as the thermal conductivity kb of the thermally conductive resin layer A14 increases, and when the thermal conductivity kb of the thermally conductive resin layer A14 is 10 (W/m·K) and the conductivity of the thermally conductive resin layer B15 is 0.2 (W/m·K), the upper and lower surface temperature difference is 30K, and the internal temperature difference is 28K. On the other hand, in the structure of the thermoelectric conversion element model of a conventional type shown in FIG. 3(b), the simulation results were obtained that when the thermal conductivity of the thermally conductive resin layer A14 is 400 (W/m·K), the maximum temperature difference ΔT is 20K. From these results, the simulation results were obtained that, in the structure of the thermoelectric conversion element model of the present invention, when the thermal conductivity kb of the thermally conductive resin layer A14 exceeds 1 (W/m·K), the maximum temperature difference ΔT is higher than that in the structure of a conventional type, and when the thermal conductivity kb of the thermally conductive resin layer A14 is 5 (W/m·K) or more, the maximum temperature difference ΔT is sufficiently higher than that in the structure of a conventional type.

Further, as shown in FIG. 5, in the thermoelectric conversion element model of the present invention, the simulation results were obtained that the temperature transition region Δx decreases as the thermal conductivity kb of the thermally conductive resin layer A14 increases. Further, as described above, the simulation results were obtained with respect to the temperature transition region Δx that in the thermoelectric conversion element model of a conventional type, the temperature transition region Δx is 177 μm when the thermal conductivity kb is 400 (W/m·K). In the thermoelectric conversion element model of the present invention, the results were obtained that when the thermal conductivity kb of the thermally conductive resin layer A14 exceeds 2 (W/m·K), the temperature transition region Δx is shorter than that of a conventional type, and when kb is 10 (W/m·K), the temperature transition region Δx is shorter by 35% than that of a conventional type. From these results, it is estimated that the thermoelectric conversion element model of the present invention has a temperature transition region Δx that is shorter than that of the model of a conventional type, and has a structure suitable for the miniaturization of the thermoelectric conversion element.

As described above, in the thermoelectric conversion element of the present invention, on one surface of a thermoelectric conversion module comprising a P-type thermoelectric element, an N-type thermoelectric element, and an electrode, a thermally conductive resin layer A and a thermally conductive resin layer B having a lower thermal conductivity than the thermally conductive resin layer A are provided in an alternating manner so as to be in direct contact with the surface, and on the other surface of the thermoelectric conversion module, a thermally conductive resin layer a and a thermally conductive resin layer b having a lower thermal conductivity than the thermally conductive resin layer a are provided in an alternating manner so as to be in direct contact with the other surface, and the positional relationship between the opposing thermally conductive resin layers, the positional relationships between the thermally conductive resin layer and the P-type thermoelectric element, the N-type thermoelectric element, and the electrode, and the like are set in the range of the present invention. Thereby, the temperature difference can be efficiently made across both the P-type thermoelectric element and the N-type thermoelectric element in the thickness direction.

INDUSTRIAL APPLICABILITY

The thermoelectric conversion element of the present invention, which can efficiently make a temperature difference, allows highly efficient power generation and reduction in the number of thermoelectric conversion modules to be installed compared with that of a conventional type, thus allowing downsizing and cost reduction. Further, as a thermoelectric conversion module of a flexible type, the thermoelectric conversion element of the present invention can be used without limiting the installation locations, for example, can be installed in a waste heat source and a radiation source each having a nonflat surface.

REFERENCE SIGNS LIST

E: Thermoelectric conversion element
1: P-type thermoelectric element
2: N-type thermoelectric element
3: Electrode (copper)
4: Thermally conductive resin layer A
4': Thermally conductive resin layer a
5: Thermally conductive resin layer B
5': Thermally conductive resin layer b
6: Thermoelectric conversion module
7: First surface of 6
8: Second surface of 6
11: P-type thermoelectric element
13: Thermoelectric conversion module
14: Thermally conductive resin layer A
14': Thermally conductive resin layer a
15: Thermally conductive resin layer B
15': Thermally conductive resin layer b
17: First surface of 13
18: Second surface of 13
19: Thermal insulation part
21: P-type thermoelectric element
23: Thermoelectric conversion module
24: Metal (copper)
25: Polyimide
26: Film-like substrate
27: Film-like substrate
29: Thermal insulation part
41: P-type thermoelectric element
42: N-type thermoelectric element
43: Electrode
44: Film-like substrate
45: Film-like substrate
46: Thermoelectric conversion module
47: Insulator (polyimide)
48: Insulator (polyimide)
49: Metal
50: Metal

The invention claimed is:

1. A thermoelectric conversion element, comprising:
a thermoelectric conversion module comprising a P-type thermoelectric element, an N-type thermoelectric element, and an electrode, and having a first surface and a second surface each comprising the P-type thermoelectric element, the N-type thermoelectric element, and the electrode, wherein the first and second surfaces are on opposite sides of the thermoelectric conversion module,
wherein
on the first surface of the thermoelectric conversion module, a thermally conductive resin layer A comprising a highly thermally conductive filler, and a thermally conductive resin layer B having a lower thermal conductivity than the thermally conductive resin layer A, are provided in a horizontal direction relative to the first surface in an alternating manner so as to be in direct contact with the first surface, and on the second surface of the thermoelectric conversion module, a thermally conductive resin layer a comprising a highly thermally conductive filler, and a thermally conductive resin layer b having a lower thermal conductivity than the thermally conductive resin layer a, are provided in a horizontal direction relative to the second surface in an alternating manner so as to be in direct contact with the second surface.

2. The thermoelectric conversion element according to claim 1, wherein the thermally conductive resin layer a is arranged opposite to the thermally conductive resin layer B, with respect to the horizontal direction; and the thermally conductive resin layer b is arranged opposite to the thermally conductive resin layer A, with respect to the horizontal direction.

3. The thermoelectric conversion element according to claim 2, wherein the thermally conductive resin layer A is in direct contact with the thermally conductive resin layer B, and the thermally conductive resin layer b is in direct contact with the thermally conductive resin layer a.

4. The thermoelectric conversion element according to claim 1, wherein the thermally conductive resin layer A is in direct contact with the thermally conductive resin layer B, and the thermally conductive resin layer b is in direct contact with the thermally conductive resin layer a.

5. The thermoelectric conversion element according to claim 1, wherein the thermally conductive resin layer A and the thermally conductive resin layer B are provided on the first surface corresponding to the P-type thermoelectric element and/or the N-type thermoelectric element, respectively;

the thermally conductive resin layer b and the thermally conductive resin layer a are provided on the second surface corresponding to the P-type thermoelectric element and/or the N-type thermoelectric element, respectively; and the thermally conductive resin layer A, the thermally conductive resin layer B, the thermally conductive resin layer a, and the thermally conductive resin layer b have the same width.

6. The thermoelectric conversion element according to claim 1, wherein the thermally conductive resin layers A and a have a thermal conductivity of 0.5 W/m·K or more, and the thermally conductive resin layers B and b have a thermal conductivity of less than 0.5 W/m·K.

7. The thermoelectric conversion element according to claim 1, wherein the thermally conductive resin layer A, the thermally conductive resin layer B, the thermally conductive resin layer a, and the thermally conductive resin layer b have the same width as the P-type thermoelectric element and the N-type thermoelectric element.

8. The thermoelectric conversion element according to claim 1, wherein the P-type thermoelectric element and the N-type thermoelectric element have a thickness of from 0.1 to 100 μm.

9. The thermoelectric conversion element according to claim 1, wherein the thermally conductive resin layer A, the thermally conductive resin layer B, the thermally conductive resin layer a, and the thermally conductive resin layer b have a thickness of from 1 to 200 μm.

* * * * *